US008766827B1

(12) United States Patent
Milne et al.

(10) Patent No.: US 8,766,827 B1
(45) Date of Patent: Jul. 1, 2014

(54) PARALLEL APPARATUS FOR HIGH-SPEED, HIGHLY COMPRESSED LZ77 TOKENIZATION AND HUFFMAN ENCODING FOR DEFLATE COMPRESSION

(71) Applicants: Andrew Milne, Ottawa (CA); Sailesh Bissessur, Phoenix, AZ (US); Quinn W. Merrell, Phoenix, AZ (US); Lokpraveen B. Mosur, Gilbert, AZ (US)

(72) Inventors: Andrew Milne, Ottawa (CA); Sailesh Bissessur, Phoenix, AZ (US); Quinn W. Merrell, Phoenix, AZ (US); Lokpraveen B. Mosur, Gilbert, AZ (US)

(73) Assignee: Intel Corporation, Santa Clara, CA (US)

( * ) Notice: Subject to any disclaimer, the term of this patent is extended or adjusted under 35 U.S.C. 154(b) by 0 days.

(21) Appl. No.: 13/853,286

(22) Filed: Mar. 29, 2013

Related U.S. Application Data

(60) Provisional application No. 61/800,263, filed on Mar. 15, 2013.

(51) Int. Cl.
 *H03M 7/34* (2006.01)
(52) U.S. Cl.
 USPC ............... 341/51; 380/45; 380/269; 380/277; 380/284; 375/343; 375/316; 342/99; 342/418; 706/48

(58) Field of Classification Search
 USPC ............... 341/50–70; 380/45, 269, 277, 284; 375/316, 343; 342/99, 418; 706/48
 See application file for complete search history.

(56) References Cited

U.S. PATENT DOCUMENTS

| 7,995,682 | B2 * | 8/2011 | Abraham et al. | 375/343 |
|---|---|---|---|---|
| 8,117,464 | B1 * | 2/2012 | Kogelnik | 713/193 |
| 8,411,859 | B2 * | 4/2013 | Teglia et al. | 380/268 |
| 8,635,180 | B2 * | 1/2014 | Biran et al. | 706/48 |

* cited by examiner

*Primary Examiner* — Lam T Mai
(74) *Attorney, Agent, or Firm* — Blakely, Sokoloff, Taylor & Zafman LLP

(57) ABSTRACT

Parallel compression is performed on an input data stream by processing circuitry. The processing circuitry includes hashing circuitry, match engines, pipeline circuitry and a match selector. The hashing circuitry identifies multiple locations in one or more history buffers for searching for a target data in the input data stream. The match engines perform multiple searches in parallel for the target data in the one or more history buffers. The pipeline circuitry performs pipelined searches for multiple sequential target data in the input data stream in consecutive clock cycles. Then the match selector selects a result from the multiple searches and pipelined searches to compress the input data stream.

20 Claims, 14 Drawing Sheets

PARALLEL APPARATUS FOR HIGH-SPEED, HIGHLY COMPRESSED LZ77 TOKENIZATION AND HUFFMAN ENCODING FOR DEFLATE COMPRESSION

RELATED APPLICATION

This application is related to, and claims the benefit of priority from, U.S. Provisional Patent Application Ser. No. 61/800,263, filed on Mar. 15, 2013.

TECHNICAL FIELD

The present disclosure pertains to the field of processing logic, microprocessors, and associated instruction set architecture that, when executed by the processor or other processing logic, perform logical, mathematical, or other functional operations.

BACKGROUND ART

LZ77 (where "LZ" stands for Lempel-Ziv) is a lossless data compression algorithm that forms the basis of several ubiquitous compression schemes, including the deflate compression algorithm. The LZ77 algorithm performs compression by matching a current input data sequence with a reference to a copy of that data sequence existing earlier in the input data stream. When a match is found, the match is encoded by a length-distance (L, D) pair. The length-distance pair indicates the equivalent of the statement "go back D characters from the current input data location, and copy L characters from that location."

To spot matches, an LZ77 encoder keeps track of the most recent data in the input data stream. The data structure in which this data is held is called a history window, which is a sliding window that updates with time. The encoder needs to keep this data to look for matches, and the decoder needs to keep this data to interpret the matches the encoder refers to. The larger the sliding window, the longer back the encoder may search for creating references.

In contemporary data processing and networking, deflate compression is often use to perform on-the-fly compression at the transmission end and decompression at the receiving end. Deflate compression is a standardized lossless data compression algorithm that uses a combination of the LZ77 compression and Huffman coding. The LZ77 compression and Huffman coding are serial in nature.

BRIEF DESCRIPTION OF THE DRAWINGS

Embodiments are illustrated by way of example and not limitation in the Figures of the accompanying drawings.

DESCRIPTION OF THE EMBODIMENTS

In the following description, numerous specific details are set forth. However, it is understood that embodiments described herein may be practiced without these specific details. In other instances, well-known circuits, structures and techniques have not been shown in detail in order not to obscure the understanding of this description.

Embodiments described herein provide a parallel mechanism for an efficient, high-throughput, high-quality deflate compression, such as in the network contexts, with high-throughput pipelines. Embodiments provide a parallel method, apparatus and system, which perform LZ77 tokenization of an input data stream in parallel on hardware. Multiple bytes are compressed per clock. Multiple searches are performed in parallel on sequential data streams, and the searches are resolved in parallel. A "funneling" match selection technique resolves the multiple outgoing tokens into a serial output stream, so the stream remains coherent and appropriately reflective of the input.

The embodiments described herein perform embedded deflate compression, which is useful for commercial operations such as networking and storage applications and systems. The embedded deflate compression improves the performance of throughput-sensitive operations such as the compression near network interfaces or for file system compression.

Typically, deflate compression is performed in serial and are executed on high-speed general-purpose processors. It is difficult to accelerate a serial implementation past the serial rates of one token per clock. The embodiments described herein therefore have significant potential commercial value.

Embodiments of the deflate compression perform parallel searches at two levels. At a first level, parallel searches are performed on a single "target" point (also referred to as "target data," "target data sequence," which can be one or more bytes/characters in the input stream). Among the search results for the single target point, the one search result that identifies the longest match in the past data sequence (also referred to as a "history window") is selected. At a second level, parallel sets of searches are performed on multiple sequential targets (e.g., the current target point and the following three bytes in the input stream). In one embodiment, the searches on these sequential targets can be performed in a pipeline. The pipelined search results can be combined such that the longest match for the sequential targets is selected. Combining the first-level parallel searches with the second-level pipelined searches allows multiple search results to be produced in every clock cycle. Following the parallel searches, the search results are Huffman encoded to generate an output stream.

Figure 1A:
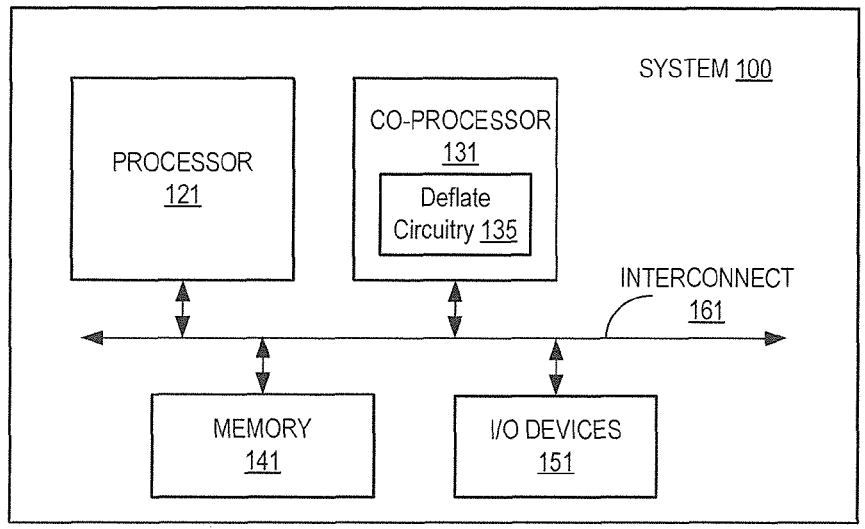
FIG. 1A is a block diagram illustrating a co-processor that performs parallel deflate compression according to one embodiment.

In one embodiment, the deflate compression can be performed by dedicated hardware coupled to the processor of a processing system. FIG. 1A is a block diagram illustrating a processing system 100 according to one embodiment. The processing system 100 includes a processor 121 coupled to a memory 141, I/O devices 151 and a co-processor 131 via a bus or interconnect 161. The co-processor 131 may be co-located on the same die as the processor 121, or on a separate die (e.g., a chipset) from the processor 121. In one embodiment, the co-processor 131 includes deflate circuitry 135 to execute deflate compression operations in response to a parallel_deflate instruction. In one embodiment, the co-processor 131 may be a communication or storage co-processor module for networking or storage purposes. It is understood that the processing system 100 is a simplified representation and other components may exists.

Figure 1B:
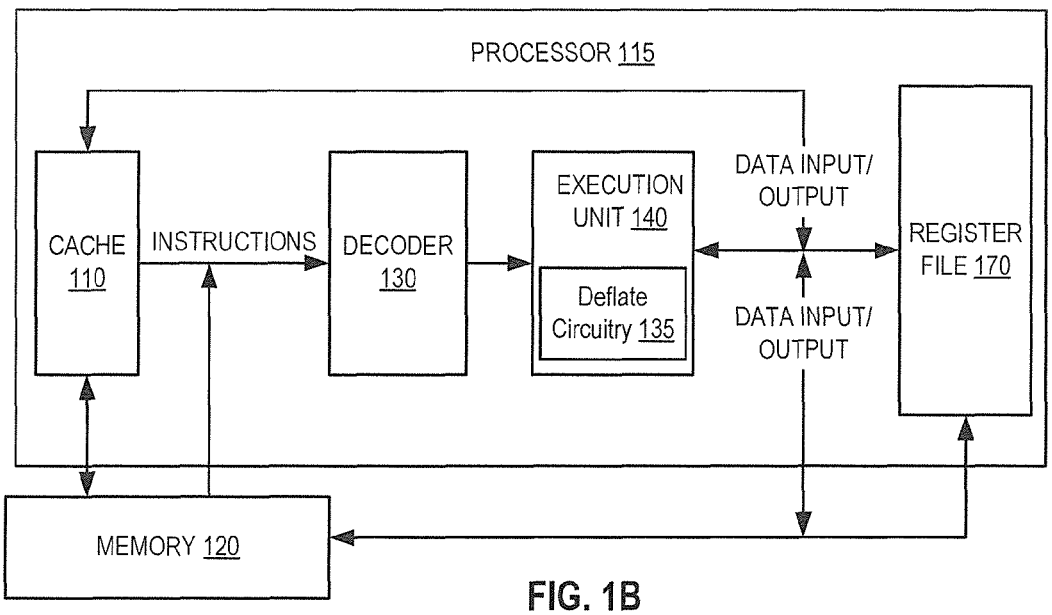
FIG. 1B is a block diagram illustrating a processor that performs parallel deflate compression according to one embodiment.

In an alternative embodiment, the deflate compression can be implemented in hardware within a processor. FIG. 1B is a block diagram of an embodiment of an instruction processing apparatus, such as a processor 115 having an execution unit 140. In one embodiment, the execution unit 140 includes the deflate circuitry 135 operable to execute instructions, including a parallel_deflate instruction. In some embodiments, the processor 115 may be a processor core of a multi-core processor, or a processing element in an electronic system.

A decoder 130 receives incoming instructions in the form of higher-level machine instructions or macroinstructions, and decodes them to generate lower-level micro-operations, micro-code entry points, microinstructions, or other lower-level instructions or control signals, which reflect and/or are derived from the original higher-level instruction. The lower-level instructions or control signals may implement the operation of the higher-level instruction through lower-level (e.g., circuit-level or hardware-level) operations. The decoder 130 may be implemented using various different mechanisms. Examples of suitable mechanisms include, but are not limited to, microcode, look-up tables, hardware implementations, programmable logic arrays (PLAs), other mechanisms used to implement decoders known in the art, etc.

The decoder 130 may receive incoming instructions for a cache 110, a memory 120 or other sources. The decoded instructions are sent to the execution unit 140. The execution unit 140 may receive from the decoder 130 one or more micro-operations, micro-code entry points, microinstructions, other instructions, or other control signals, which reflect, or are derived from the received instructions. The execution unit 140 receives data input from and generates data output to a register file 170, the cache 110, and/or the memory 120.

To avoid obscuring the description, a relatively simple processor 115 has been shown and described. It is to be appreciated that other embodiments may have more than one execution unit. For example, the processor 115 may include multiple different types of execution units, such as, for example, arithmetic units, arithmetic logic units (ALUs), integer units, floating point units, etc. Still other embodiments of instruction processing apparatus or processors may have multiple cores, logical processors, or execution engines. A number of embodiments of the processor 115 will be provided later with respect to FIGS. 7-13.

Figure 2:
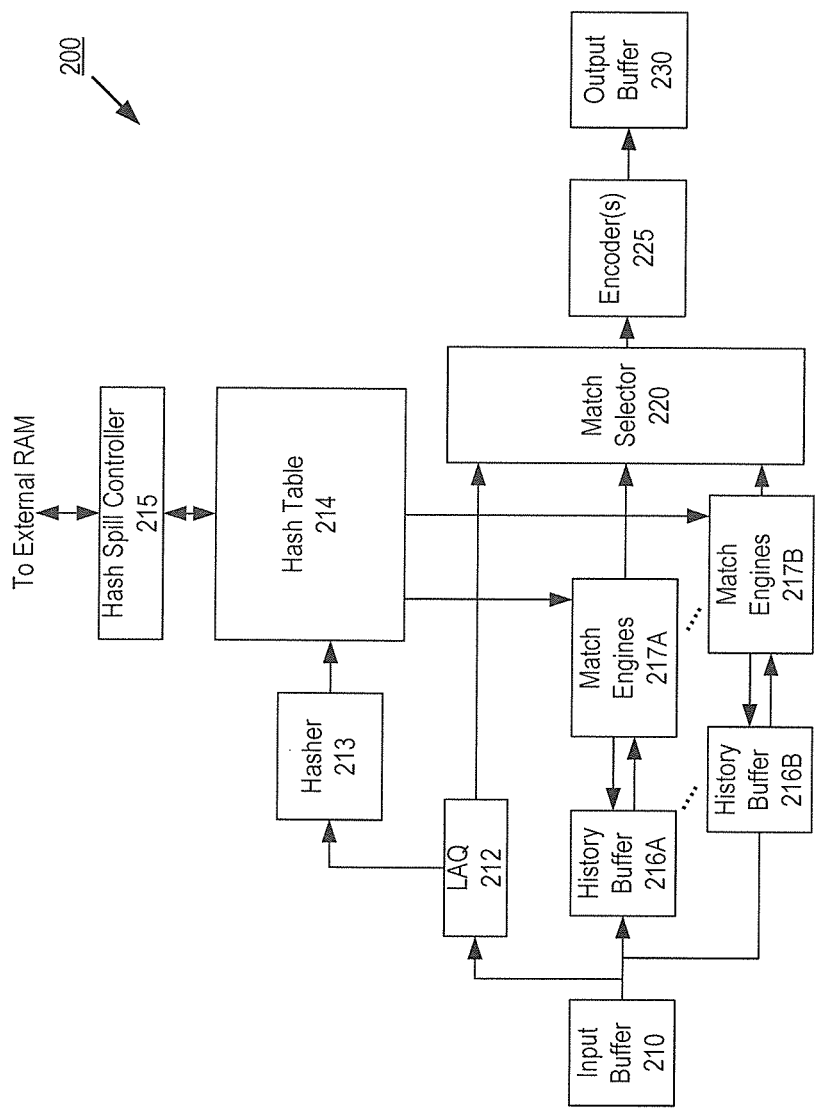
FIG. 2 is a block diagram of parallel deflate compression circuitry according to one embodiment.

FIG. 2 is a block diagram illustrating an example of a compression module 200 (e.g., the deflate circuitry 135 of FIG. 1A or 1B) according to one embodiment. In this embodiment, the compression module 200 performs parallel searches on a single target point. The compression module 200 includes an input buffer 210 that buffers an input data stream. The input data stream is fed into a look-aside queue (LAQ) 212 and history buffers 216A and 216B. The LAQ 212 stores a current data sequence to be compressed, and the history buffers 216A-B are sliding windows that store a past data sequence in the same input data stream. In this embodiment, it is assumed that each history buffer 216A-B has only one read port; therefore, the past data sequence is duplicated such that each history buffer 216A-B stores an identical copy of the past data sequence. In an alternative embodiment where the history buffer has multiple read/write ports, only one such history buffer is needed. The data in the history buffers 216A-B is searched and matched with the current data sequence by match engines 217A and 217B in parallel.

For simplicity of the illustration, only two match engines 217A-B are shown. It is appreciated that the compression module 200 may include any number of match engines to perform any number of matches in parallel.

In one embodiment, to improve the search speed, the current data sequence is hashed by a hash function unit (e.g., a hasher 213). The result of the hash is a pointer (e.g., an address or index) to a hash table 214. In that address of the hash table 214 stores a number of entries, each entry containing a reference, and each reference pointing to a location in the history buffer 216A-B. If the number of references that can be stored in the hash table 214 exceeds the capacity of the hash table 214, a hash spill controller 215 determines which of the entries in the hash table 214 can be moved to an external memory. For example, the entries that can be moved out of the hash table 214 may be the ones that are least used or least recently used. Using the hash table 214, the match engines 217A-B can narrow the search to those locations in the history buffer 216A-B to determine whether the search target in the LAQ 212 matches any portion of data sequence in the history buffer 216A-B. From the outputs of the match engines 217A-B, a matched selector 220 selects one of the outputs that has the longest match for the search target. The selected matched output is sent to one or more encoders 225, which encode the data stream and send the encoded stream to an output buffer 230.

Figure 3:
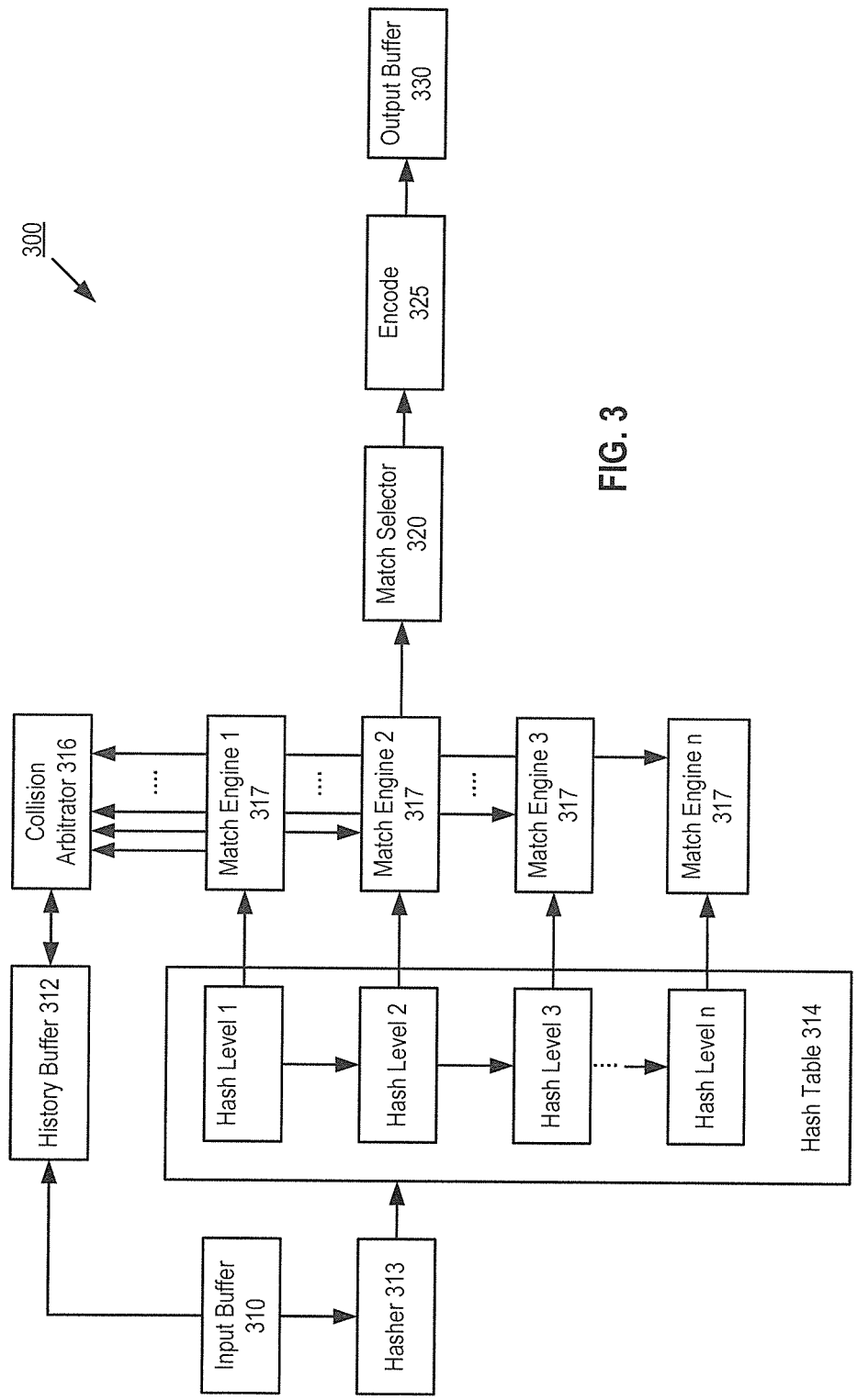
FIG. 3 is a block diagram of parallel deflate compression circuitry according to another embodiment.

FIG. 3 is a block diagram illustrating an example of a compression module 300 (e.g., the deflate circuitry 135 of FIG. 1A or 1B) according to another embodiment. In this embodiment, the compression module 300 includes an input buffer 310 that buffers an input data stream. The input data stream is fed into a history buffer 312. The input data stream is hashed by a hash function unit (e.g., a hasher 313). The result of the hash is a pointer (e.g., an address or index) to a hash table 314. In this embodiment, the hash table 314 includes multiple levels. When an input data sequence (i.e., a target point) is hashed, the hashed value is a pointer that points to a "bucket" in the hash table 314. Each bucket contains multiple entries, with each entry in a different hash level. Each entry contains a reference (indicating a location) to the history buffer 312. These multiple locations of the history buffer 312 can be independent searched and compared with the target point.

In one embodiment, each match level has a corresponding match engine 317. The match engines 317 perform searches in different locations of the history buffer 312 in parallel for a single target point. The match engines 317 may access the history buffer 312 through a collision arbitrator 316, which resolves conflict in the accessing operations. The outputs of the match engines 317 are compared by the match selector 320, and the output that has the longest match is selected. The selected matched output is sent to one or more encoders 325, which encode the data stream and send the encoded stream to an output buffer 330.

Figure 4A:
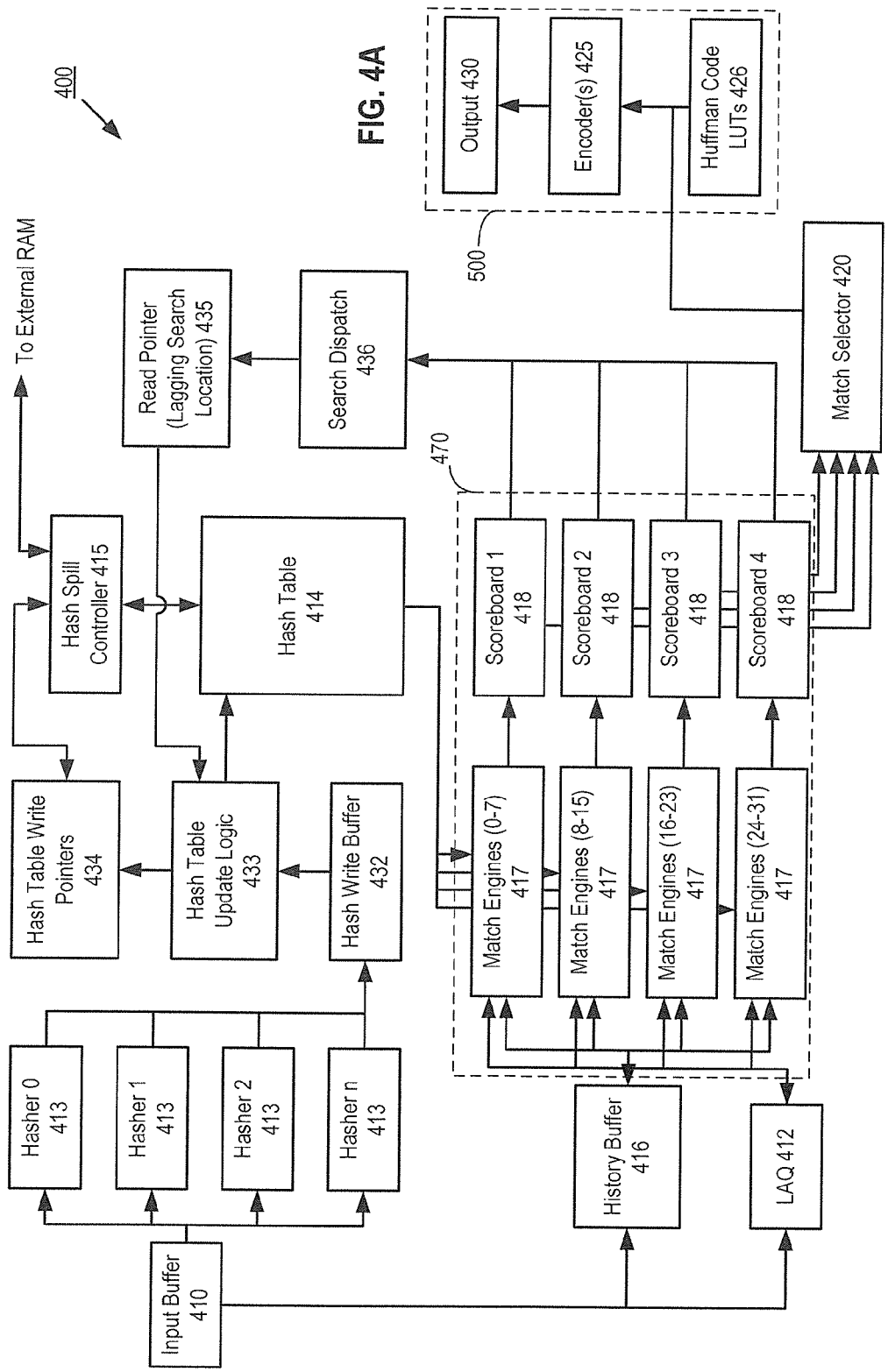
FIG. 4A is a block diagram of parallel deflate compression circuitry according to yet another embodiment.

FIG. 4A is a block diagram illustrating an example of a compression module 400 (e.g., the deflate circuitry 135 of FIG. 1A or 1B) according to another embodiment. In this embodiment, parallel searches (e.g., four parallel searches) are performed on multiple sequential target points (e.g., eight target points) in the input data stream. At the first level of match selection, the best match is selected for the parallel searches operating on a single target point. At the second level of match selection, the best match for the sequential targets is selected and integrated with the parallel search results to select a combination that produces the best compression.

In this embodiment, the compression module 400 includes an input buffer 410 that buffers an input data stream. The input data stream is fed into a history buffer 416 and an LAQ 412. The four input targets are each hashed by a hash function unit (e.g., a hasher 413). The result of the hash is a pointer to an address (or index) of a hash table 414. To write to the hash table 414, hasher outputs are first sent to a hash write buffer 432, which is coupled to a hash table update logic 433. The hash table update logic 433 is further coupled to a hash table write pointers 434. The hash table write pointers 434 point to the next bucket to write to in the hash table bucket chains, and are available for very rapid read/increments, up to n read/increment events per cycle, where n is the number of hashers.

The hash table update logic 433 and the hash table write pointers 434 controls whether a write to the hash table 414 is allowed (e.g., when there is no conflict to the access) and where in the hash table 414 to write. If the number of entries that can be stored in the hash table 414 exceeds its capacity, a hash spill controller 415 determines which of the entries in the hash table 414 can be moved to an external memory. In this embodiment, the throughput of the hashing circuitry section is n, where n>the minimum throughput of four bytes per cycle. This throughput enables "jump-ahead" when long matches allow the processing to hop quickly through the search buffer with the search engines latent.

In the meantime, the sequential targets also enter the history buffer 416 and the LAQ 412. Based on the references in the hash table 314, the match engines 417 searches the locations indicated by the references in the history buffer 416. In each clock cycle, four searches are performed and each search is up to eight deep (that is, eight pipeline stages); up to 32 match engines 417 run per cycle. Each group of eight match engines 417 is associated with a scoreboard 418. The scoreboard 418 keeps track of the matched results for the sequential targets and forwarded those results to a match selector 420. The match selector 420 selects the longest match for a single target, and integrates the match results of the four sequential targets. The generated matched output is sent to an encoder 425, which encodes the data stream using Huffman code lookup tables (LUTs) 436 and sends the encoded stream to an output buffer 430.

Figure 4B:
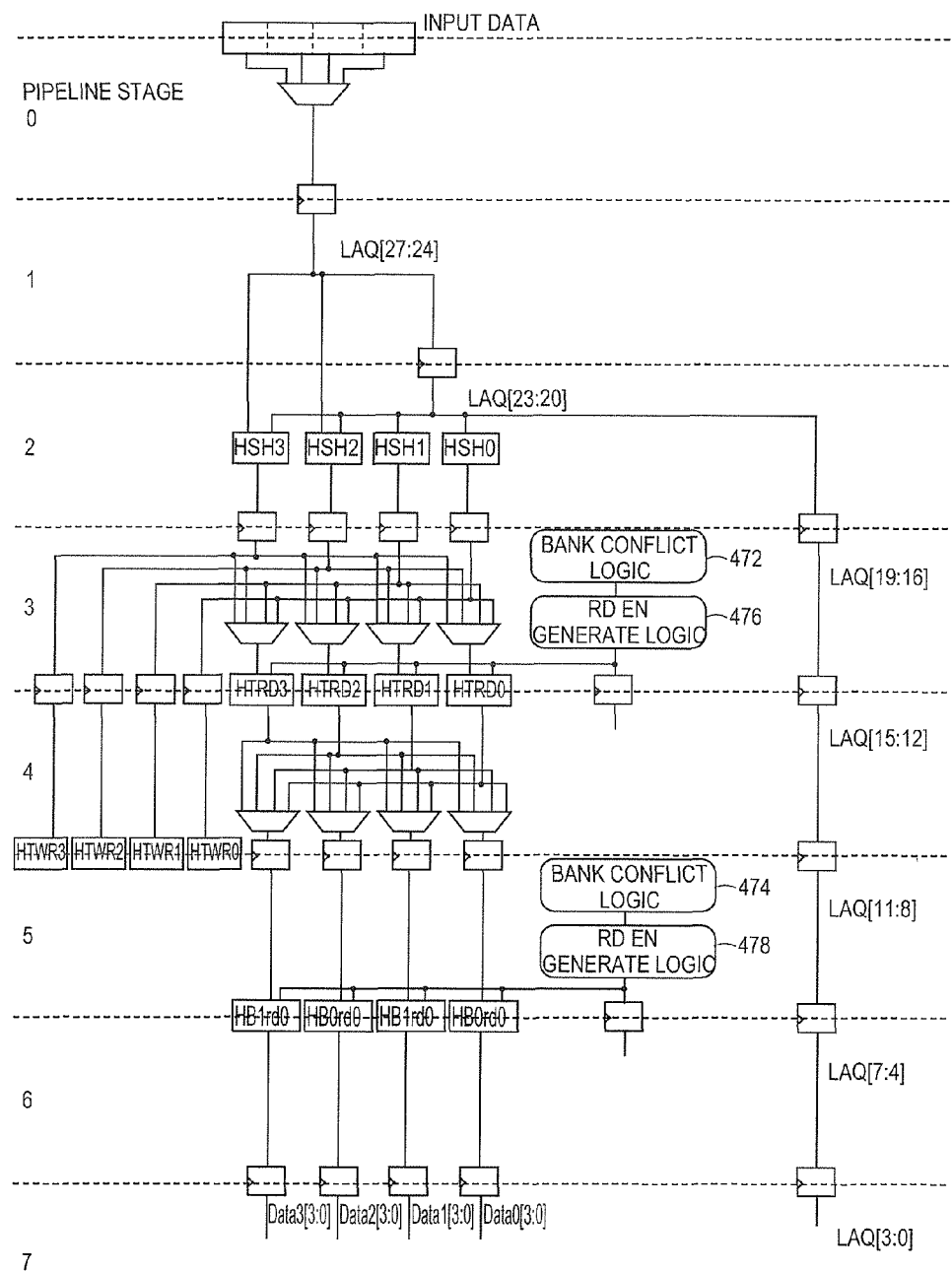
FIG. 4B illustrate an example of a pipeline for performing parallel searches according to one embodiment.

FIG. 4B illustrates an example of a pipeline that performs pipelined parallel searches for input data sequences according to one embodiment. The pipeline performs parallel searches on an input data sequence in eight pipeline stages (which correspond to eight clock cycles), indicated as stages 0-7 from top to bottom. The pipeline of FIG. 4B is an alternative embodiment of the block 470 of FIG. 4A. In this embodiment, an input data sequence (which contains four target points) is processed in each clock cycle. The input at the top contains four target points (e.g., four-byte data) in the LAQ, and the output at the bottom is the data output of the history buffer, which is compared to the appropriate bytes of the LAQ to determine if there is a match. In pipeline stage 3, four read requests are issued to the hash table (indicated as HTRD0-3) to determine the locations of the history buffer to be read. In pipeline stage 5, 16 read requests are issued to the history buffer (indicated as HB0rd0 and HR1rd0). In this embodiment, there are 16 read requests to the history buffer because this embodiment is designed to work on four consecutive stream bytes at a time. A hash and hash table lookup is performed for each of the four bytes. Each lookup yields the contents of four hash buckets (levels) that are assigned to the hash address. The hash table outputs 16 history buffer addresses. The read requests to the hash table and to the history buffer are enabled by the read enable generate logic (indicated as "RD EN generate logic" 472 and 474). There are physical limitations to the number of reads that can be performed when the read addresses are to the same memory location or to areas that are in the same vicinity. This limitation or constraint is called a bank conflict. When a bank conflict occurs, one or more of the multiple read requests cannot be satisfied in that clock, and therefore are dropped or rescheduled. Bank conflicts are resolved by bank conflict logic 476 and 478.

After the parallel searches, the search results are assembled into a sequential stream of LZ77 tokens. The LZ77 tokens include the "literals" (the data for which a match cannot be found in the history buffer) and the (distance, length) pairs (when a match can be found). Each token has a variable size. The stream of LZ77 tokens is encoded according to Huffman encoding in parallel.

Figure 5:
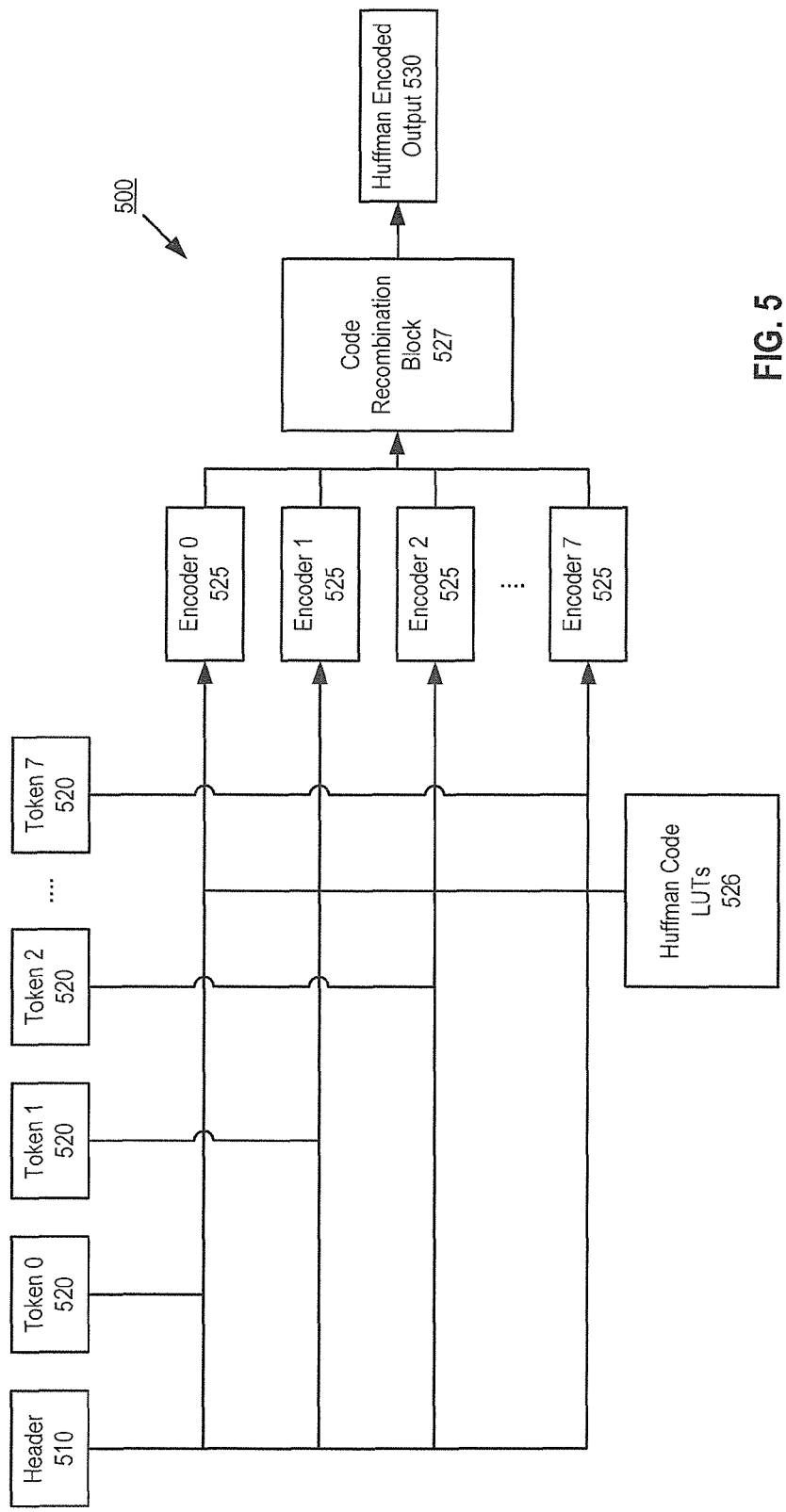
FIG. 5 is a block diagram of parallel encoding circuitry according to one embodiment.

FIG. 5 illustrates an example of parallel encoding of a LZ77 token stream 520 according to one embodiment. In this embodiment, eight LZ77 tokens 520 are encoded in parallel, where the Huffman encoding is performed by looking up a table (e.g., a Huffman code lookup table (LUT) 526). It is appreciated that in alternative embodiments, a different number of LZ77 tokens may be encoded in parallel. A single "packet" from the compression output (match selector output) contains a header 510 and a payload containing eight LZ77 tokens 520. The header 510 provides information about an offset of each token 520 such that each token 520 can be located and processed independently of the other tokens. In one embodiment, each token 520 is either an 8-bit literal or a 24-bit reference. The header 510 may be 16 bits, which includes 8 pairs of bits each signaling whether the corresponding token in the payload is a literal or a reference (or indicating the end of the packet). The use of header 510 allows rapid and parallel lookup of each token 520 independently.

Using the Huffman code LUT 526, the eight LZ77 tokens 520 are encoded by eight encoders 525 in parallel. For each token 520, the corresponding encoder 525 outputs a code and a length. Each encoder 525 looks first at the bits in the header 510 to find the offset of its own token in the payload. For example, the encoder 525 may need to determine how many literals and references are ahead of its token to do find the offset. Then the encoder 525 encodes its own token, outputting a code and a length. The encoded output are re-assembled by a code re-combination block 527 into a sequential stream of Huffman encoded output 530, which is also the final output of the parallel deflate compression.

Figure 6:
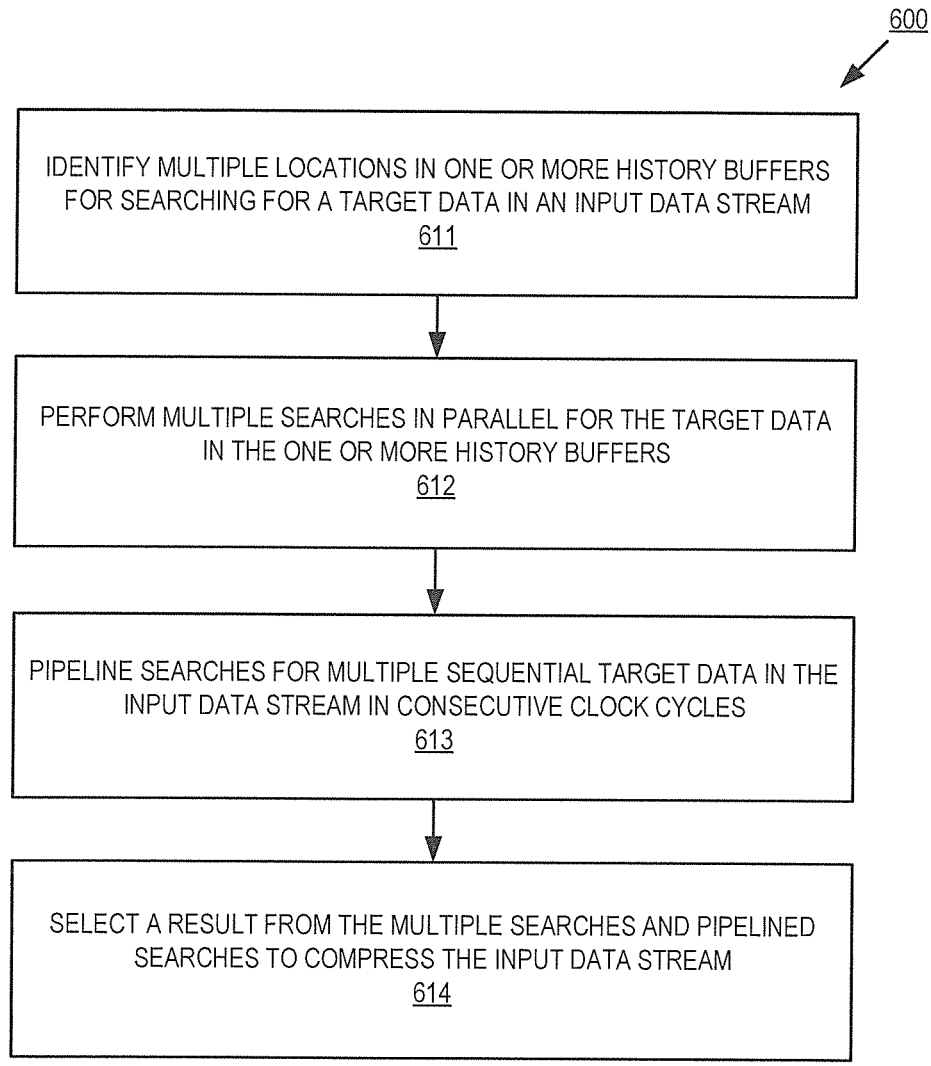
FIG. 6 is a flow diagram illustrating operations to be performed responsive to a parallel deflate instruction according to one embodiment.

FIG. 6 is a block flow diagram of a method 600 for performing parallel compression based on LZ77 compression according to one embodiment. The parallel compression may be part of parallel deflate compression. In one embodiment, the parallel compression is performed in response to a parallel_deflate instruction.

The method 600 begins with processing circuitry (e.g., the co-processor 131 of FIG. 1A or the execution unit 140 of FIG. 1B) performing a parallel compression on an input data stream. Multiple locations in one or more history buffers are identified for searching for a target data in the input data stream (611). Multiple searches are performed in parallel for the target data in the one or more history buffers (612). Pipelined searches are performed for multiple sequential target data in the input data stream in consecutive clock cycles (613). Then a result is selected from the multiple searches and pipelined searches to compress the input data stream (614).

In one embodiment, the method 600 further comprises: assembling results from the multiple searches and the pipelined searches as a sequence of tokens and a header, wherein the header provides information about an offset of each of the tokens in the sequence; and encoding the tokens in parallel. In one embodiment, when selecting the result from the multiple searches and the pipelined searches, the processing circuitry is to select a longest match from the multiple searches, and to integrate the longest match from the multiple searches with results of the pipelined searches. In one embodiment, when identifying the multiple locations, the processing circuitry is to hash the target data to obtain a pointer that points to a plurality of entries in a hash table, wherein the entries contain multiple references to the multiple locations of the one or more history buffers. The multiple references are used to allow the multiple locations to be read in parallel.

In one embodiment, the results of the multiple searches are tracked for the target data in a scoreboard. Multiple scoreboards are updated for each of the multiple sequential target data. In one embodiment, when the processing circuitry receives an instruction to perform a network function, it performs deflate compression on the input data stream in response to the instruction, wherein the deflate compression includes the multiple searches and the pipelined searches.

In various embodiments, the method of FIG. 6 may be performed by a general-purpose processor, a special-purpose processor (e.g., a graphics processor or a digital signal processor), or another type of digital logic device or instruction processing apparatus. In some embodiments, the method of FIG. 6 may be performed by the co-processor 131 of FIG. 1A, the processor 115 of FIG. 1B, or a similar processor, apparatus, or system, such as the embodiments shown in FIGS. 7-13. Moreover, the co-processor 131 of FIG. 1A, the processor 115 of FIG. 1B, as well as the processor, apparatus, or system shown in FIGS. 7-13 may perform embodiments of operations and methods either the same as, similar to, or different than those of the method of FIG. 6.

Exemplary Core Architectures
In-Order and Out-of-Order Core Block Diagram

Figure 7A:
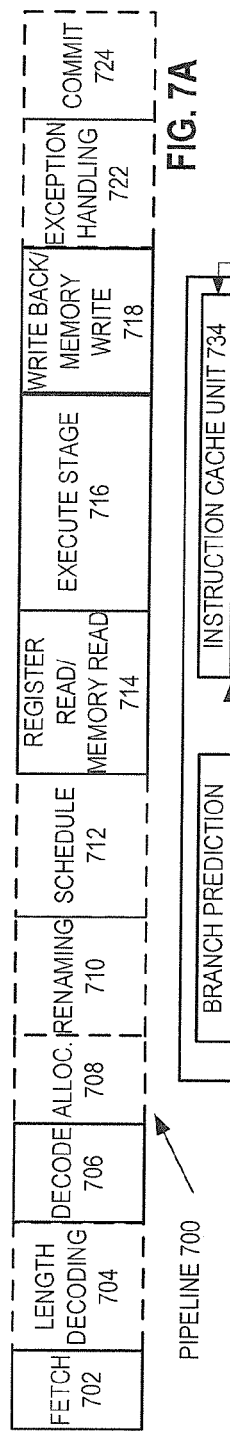
FIG. 7A is a block diagram of an in-order and out-of-order pipeline according to one embodiment.
Figure 7B:
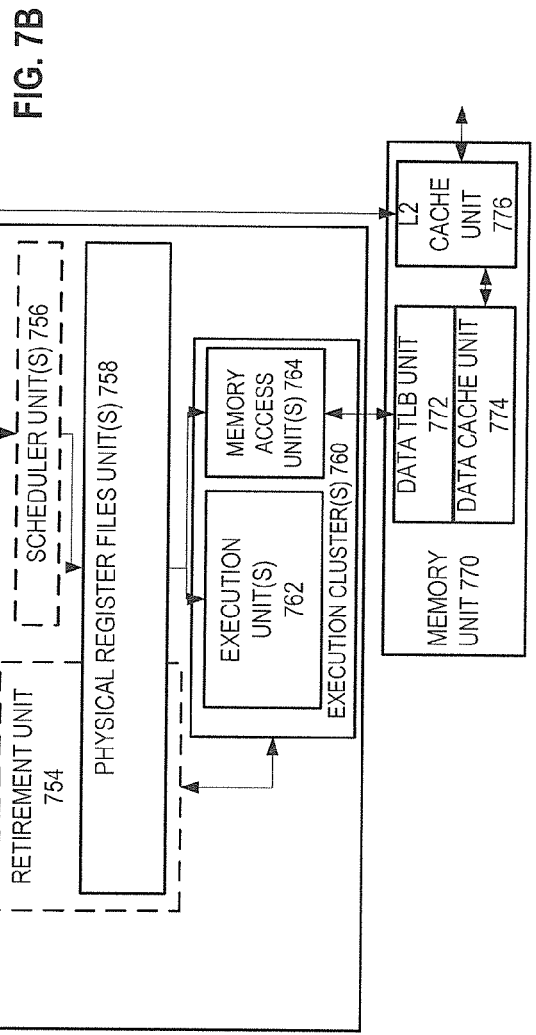
FIG. 7B is a block diagram of an in-order and out-of-order core according to one embodiment.

FIG. 7A is a block diagram illustrating both an exemplary in-order pipeline and an exemplary register renaming, out-of-order issue/execution pipeline according to one embodiment. FIG. 7B is a block diagram illustrating both an exemplary embodiment of an in-order architecture core and an exemplary register renaming, out-of-order issue/execution architecture core to be included in a processor according to one embodiment. The solid lined boxes in FIGS. 7A and 7B illustrate the in-order pipeline and in-order core, while the optional addition of the dashed lined boxes illustrates the register renaming, out-of-order issue/execution pipeline and core. Given that the in-order aspect is a subset of the out-of-order aspect, the out-of-order aspect will be described.

In FIG. 7A, a processor pipeline 700 includes a fetch stage 702, a length decode stage 704, a decode stage 706, an allocation stage 708, a renaming stage 710, a scheduling (also known as a dispatch or issue) stage 712, a register read/memory read stage 714, an execute stage 716, a write back/memory write stage 718, an exception handling stage 722, and a commit stage 724.

FIG. 7B shows processor core 790 including a front end unit 730 coupled to an execution engine unit 750, and both are coupled to a memory unit 770. The core 790 may be a reduced instruction set computing (RISC) core, a complex instruction set computing (CISC) core, a very long instruction word (VLIW) core, or a hybrid or alternative core type. As yet another option, the core 790 may be a special-purpose core, such as, for example, a network or communication core, compression engine, coprocessor core, general purpose computing graphics processing unit (GPGPU) core, graphics core, or the like.

The front end unit 730 includes a branch prediction unit 732 coupled to an instruction cache unit 734, which is coupled to an instruction translation lookaside buffer (TLB) 736, which is coupled to an instruction fetch unit 738, which is coupled to a decode unit 740. The decode unit 740 (or decoder) may decode instructions, and generate as an output one or more micro-operations, micro-code entry points, microinstructions, other instructions, or other control signals, which are decoded from, or which otherwise reflect, or are derived from, the original instructions. The decode unit 740 may be implemented using various different mechanisms. Examples of suitable mechanisms include, but are not limited to, look-up tables, hardware implementations, programmable logic arrays (PLAs), microcode read only memories (ROMs), etc. In one embodiment, the core 790 includes a microcode ROM or other medium that stores microcode for certain macroinstructions (e.g., in decode unit 740 or otherwise within the front end unit 730). The decode unit 740 is coupled to a rename/allocator unit 752 in the execution engine unit 750.

The execution engine unit 750 includes the rename/allocator unit 752 coupled to a retirement unit 754 and a set of one or more scheduler unit(s) 756. The scheduler unit(s) 756 represents any number of different schedulers, including reservations stations, central instruction window, etc. The scheduler unit(s) 756 is coupled to the physical register file(s) unit(s) 758. Each of the physical register file(s) units 758 represents one or more physical register files, different ones of which store one or more different data types, such as scalar integer, scalar floating point, packed integer, packed floating point, vector integer, vector floating point, status (e.g., an instruction pointer that is the address of the next instruction to be executed), etc. In one embodiment, the physical register file(s) unit 758 comprises a vector registers unit, a write mask registers unit, and a scalar registers unit. These register units may provide architectural vector registers, vector mask registers, and general purpose registers. The physical register file(s) unit(s) 758 is overlapped by the retirement unit 754 to illustrate various ways in which register renaming and out-of-order execution may be implemented (e.g., using a reorder buffer(s) and a retirement register file(s); using a future file(s), a history buffer(s), and a retirement register file(s); using a register maps and a pool of registers; etc.). The retirement unit 754 and the physical register file(s) unit(s) 758 are coupled to the execution cluster(s) 760. The execution cluster(s) 760 includes a set of one or more execution units 762 and a set of one or more memory access units 764. The execution units 762 may perform various operations (e.g., shifts, addition, subtraction, multiplication) and on various types of data (e.g., scalar floating point, packed integer, packed floating point, vector integer, vector floating point). While some embodiments may include a number of execution units dedicated to specific functions or sets of functions, other embodiments may include only one execution unit or multiple execution units that all perform all functions. The scheduler unit(s) 756, physical register file(s) unit(s) 758, and execution cluster(s) 760 are shown as being possibly plural because certain embodiments create separate pipelines for certain types of data/operations (e.g., a scalar integer pipeline, a scalar floating point/packed integer/packed floating point/vector integer/ vector floating point pipeline, and/or a memory access pipeline that each have their own scheduler unit, physical register file(s) unit, and/or execution cluster—and in the case of a separate memory access pipeline, certain embodiments are implemented in which only the execution cluster of this pipeline has the memory access unit(s) 764). It should also be understood that where separate pipelines are used, one or more of these pipelines may be out-of-order issue/execution and the rest in-order.

The set of memory access units 764 is coupled to the memory unit 770, which includes a data TLB unit 772 coupled to a data cache unit 774 coupled to a level 2 (L2) cache unit 776. In one exemplary embodiment, the memory access units 764 may include a load unit, a store address unit, and a store data unit, each of which is coupled to the data TLB unit 772 in the memory unit 770. The instruction cache unit 734 is further coupled to a level 2 (L2) cache unit 776 in the memory unit 770. The L2 cache unit 776 is coupled to one or more other levels of cache and eventually to a main memory.

By way of example, the exemplary register renaming, out-of-order issue/execution core architecture may implement the pipeline 700 as follows: 1) the instruction fetch 738 performs the fetch and length decoding stages 702 and 704; 2) the decode unit 740 performs the decode stage 706; 3) the rename/allocator unit 752 performs the allocation stage 708 and renaming stage 710; 4) the scheduler unit(s) 756 performs the schedule stage 712; 5) the physical register file(s) unit(s) 758 and the memory unit 770 perform the register read/memory read stage 714; the execution cluster 760 perform the execute stage 716; 6) the memory unit 770 and the physical register file(s) unit(s) 758 perform the write back/ memory write stage 718; 7) various units may be involved in the exception handling stage 722; and 8) the retirement unit 754 and the physical register file(s) unit(s) 758 perform the commit stage 724.

The core 790 may support one or more instructions sets (e.g., the x86 instruction set (with some extensions that have been added with newer versions); the MIPS instruction set of MIPS Technologies of Sunnyvale, Calif.; the ARM instruction set (with optional additional extensions such as NEON) of ARM Holdings of Sunnyvale, Calif.), including the instruction(s) described herein. In one embodiment, the core 790 includes logic to support a packed data instruction set extension (e.g., SSE, AVX1, AVX2, etc.), thereby allowing the operations used by many multimedia applications to be performed using packed data.

It should be understood that the core may support multithreading (executing two or more parallel sets of operations or threads), and may do so in a variety of ways including time sliced multithreading, simultaneous multithreading (where a single physical core provides a logical core for each of the threads that physical core is simultaneously multithreading), or a combination thereof (e.g., time sliced fetching and decoding and simultaneous multithreading thereafter such as in the Intel® Hyperthreading technology).

While register renaming is described in the context of out-of-order execution, it should be understood that register renaming may be used in an in-order architecture. While the illustrated embodiment of the processor also includes separate instruction and data cache units 734/774 and a shared L2 cache unit 776, alternative embodiments may have a single internal cache for both instructions and data, such as, for example, a Level 1 (L1) internal cache, or multiple levels of internal cache. In some embodiments, the system may include a combination of an internal cache and an external cache that is external to the core and/or the processor. Alternatively, all of the cache may be external to the core and/or the processor.

Specific Exemplary In-Order Core Architecture

Figure 8B:
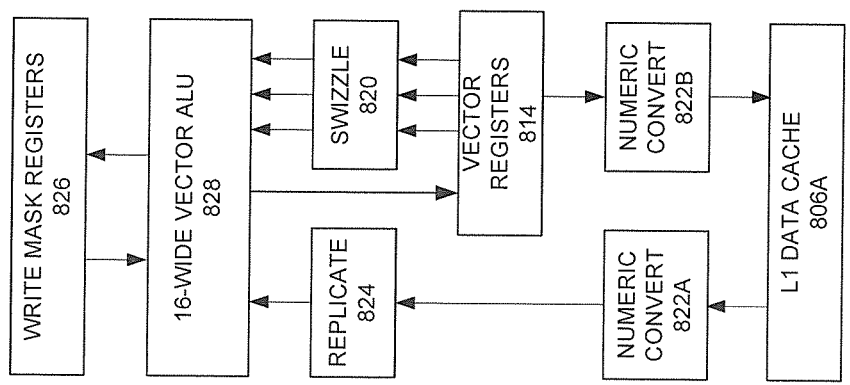
FIGS. 8A-B are block diagrams of a more specific exemplary in-order core architecture according to one embodiment.
Figure 8A:
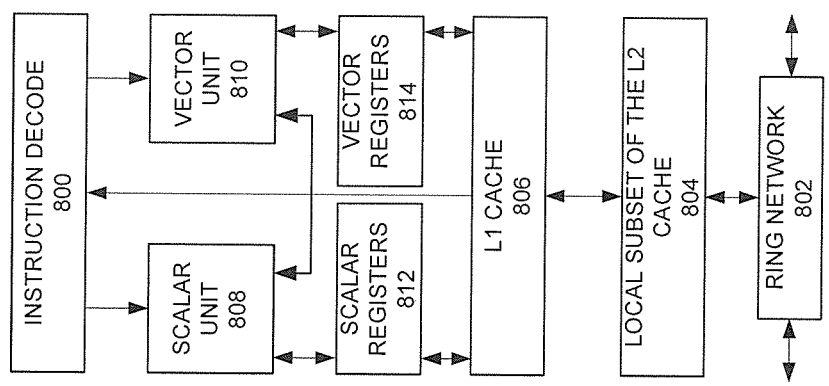

FIGS. 8A-B illustrate a block diagram of a more specific exemplary in-order core architecture, which core would be one of several logic blocks (including other cores of the same type and/or different types) in a chip. The logic blocks communicate through a high-bandwidth interconnect network (e.g., a ring network) with some fixed function logic, memory I/O interfaces, and other necessary I/O logic, depending on the application.

FIG. 8A is a block diagram of a single processor core, along with its connection to the on-die interconnect network 802 and with its local subset of the Level 2 (L2) cache 804, according to one embodiment. In one embodiment, an instruction decoder 800 supports the x86 instruction set with a packed data instruction set extension. An L1 cache 806 allows low-latency accesses to cache memory into the scalar and vector units. While in one embodiment (to simplify the design), a scalar unit 808 and a vector unit 810 use separate register sets (respectively, scalar registers 812 and vector registers 814) and data transferred between them is written to memory and then read back in from a level 1 (L1) cache 806, alternative embodiments may use a different approach (e.g., use a single register set or include a communication path that allow data to be transferred between the two register files without being written and read back).

The local subset of the L2 cache 804 is part of a global L2 cache that is divided into separate local subsets, one per processor core. Each processor core has a direct access path to its own local subset of the L2 cache 804. Data read by a processor core is stored in its L2 cache subset 804 and can be accessed quickly, in parallel with other processor cores accessing their own local L2 cache subsets. Data written by a processor core is stored in its own L2 cache subset 804 and is flushed from other subsets, if necessary. The ring network ensures coherency for shared data. The ring network is bi-directional to allow agents such as processor cores, L2 caches and other logic blocks to communicate with each other within the chip.

FIG. 8B is an expanded view of part of the processor core in FIG. 8A according to one embodiment. FIG. 8B includes an L1 data cache 806A part of the L1 cache 804, as well as more detail regarding the vector unit 810 and the vector registers 814. Specifically, the vector unit 810 is a 16-wide vector processing unit (VPU) (see the 16-wide ALU 828), which executes one or more of integer, single-precision float, and double-precision float instructions. The VPU supports swizzling the register inputs with swizzle unit 820, numeric conversion with numeric convert units 822A-B, and replication with replication unit 824 on the memory input. Write mask registers 826 allow predicating resulting vector writes.

Processor with Integrated Memory Controller and Graphics

Figure 9:
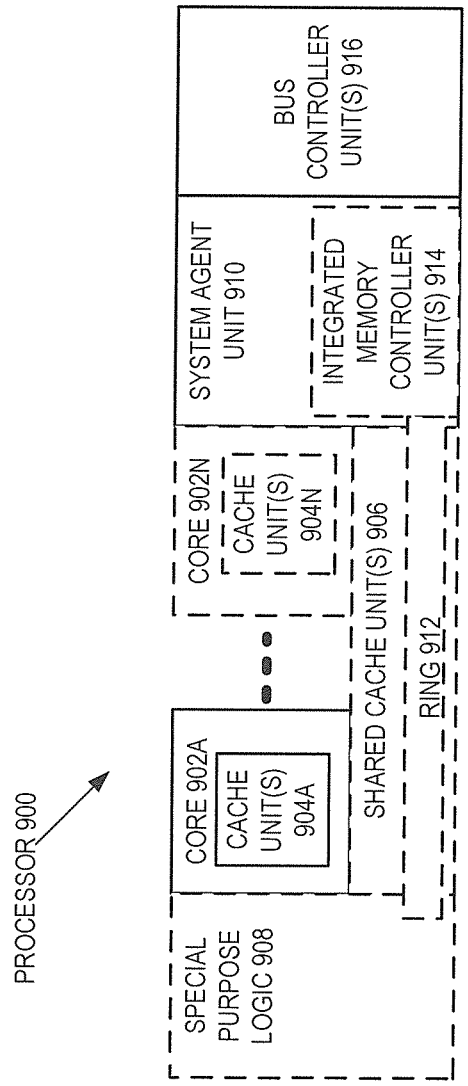
FIG. 9 is a block diagram of a processor according to one embodiment.

FIG. 9 is a block diagram of a processor 900 that may have more than one core, may have an integrated memory controller, and may have integrated graphics according to one embodiment. The solid lined boxes in FIG. 9 illustrate a processor 900 with a single core 902A, a system agent 910, a set of one or more bus controller units 916, while the optional addition of the dashed lined boxes illustrates an alternative processor 900 with multiple cores 902A-N, a set of one or more integrated memory controller unit(s) 914 in the system agent unit 910, and special purpose logic 908.

Thus, different implementations of the processor 900 may include: 1) a CPU with the special purpose logic 908 being integrated graphics and/or scientific (throughput) logic (which may include one or more cores), and the cores 902A-N being one or more general purpose cores (e.g., general purpose in-order cores, general purpose out-of-order cores, a combination of the two); 2) a coprocessor with the cores 902A-N being a large number of special purpose cores intended primarily for graphics and/or scientific (throughput); and 3) a coprocessor with the cores 902A-N being a large number of general purpose in-order cores. Thus, the processor 900 may be a general-purpose processor, coprocessor or special-purpose processor, such as, for example, a network or communication processor, compression engine, graphics processor, GPGPU (general purpose graphics processing unit), a high-throughput many integrated core (MIC) coprocessor (including 30 or more cores), embedded processor, or the like. The processor may be implemented on one or more chips. The processor 900 may be a part of and/or may be implemented on one or more substrates using any of a number of process technologies, such as, for example, BiCMOS, CMOS, or NMOS.

The memory hierarchy includes one or more levels of cache within the cores, a set or one or more shared cache units 906, and external memory (not shown) coupled to the set of integrated memory controller units 914. The set of shared cache units 906 may include one or more mid-level caches, such as level 2 (L2), level 3 (L3), level 4 (L4), or other levels of cache, a last level cache (LLC), and/or combinations thereof. While in one embodiment a ring based interconnect unit 912 interconnects the integrated graphics logic 908, the set of shared cache units 906, and the system agent unit 910/integrated memory controller unit(s) 914, alternative embodiments may use any number of well-known techniques for interconnecting such units. In one embodiment, coherency is maintained between one or more cache units 906 and cores 902-A-N.

In some embodiments, one or more of the cores 902A-N are capable of multi-threading. The system agent 910 includes those components coordinating and operating cores 902A-N. The system agent unit 910 may include for example a power control unit (PCU) and a display unit. The PCU may be or include logic and components needed for regulating the power state of the cores 902A-N and the integrated graphics logic 908. The display unit is for driving one or more externally connected displays.

The cores 902A-N may be homogenous or heterogeneous in terms of architecture instruction set; that is, two or more of the cores 902A-N may be capable of execution the same instruction set, while others may be capable of executing only a subset of that instruction set or a different instruction set.

Exemplary Computer Architectures

FIGS. 10-13 are block diagrams of exemplary computer architectures. Other system designs and configurations known in the arts for laptops, desktops, handheld PCs, personal digital assistants, engineering workstations, servers, network devices, network hubs, switches, embedded processors, digital signal processors (DSPs), graphics devices, video game devices, set-top boxes, micro controllers, cell phones, portable media players, hand held devices, and various other electronic devices, are also suitable. In general, a huge variety of systems or electronic devices capable of incorporating a processor and/or other execution logic as disclosed herein are generally suitable.

Figure 10:
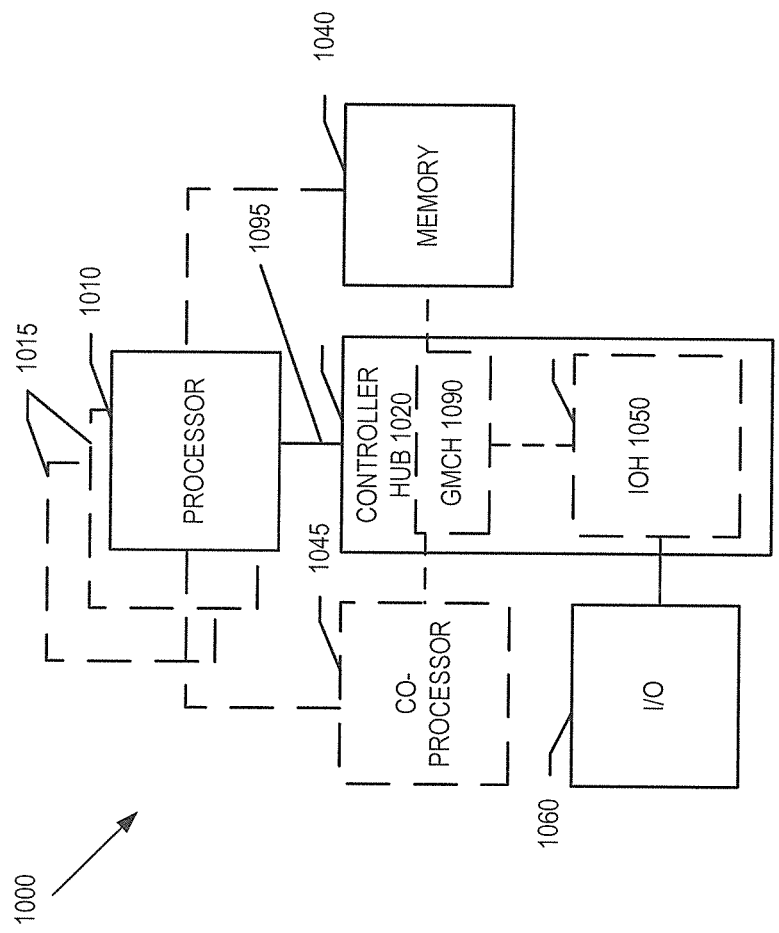
FIG. 10 is a block diagram of a system in accordance with one embodiment.

Referring now to FIG. 10, shown is a block diagram of a system 1000 in accordance with one embodiment. The system 1000 may include one or more processors 1010, 1015, which are coupled to a controller hub 1020. In one embodiment the controller hub 1020 includes a graphics memory controller hub (GMCH) 1090 and an Input/Output Hub (IOH) 1050 (which may be on separate chips); the GMCH 1090 includes memory and graphics controllers to which are coupled memory 1040 and a coprocessor 1045; the IOH 1050 is couples input/output (I/O) devices 1060 to the GMCH 1090. Alternatively, one or both of the memory and graphics controllers are integrated within the processor (as described herein), the memory 1040 and the coprocessor 1045 are coupled directly to the processor 1010, and the controller hub 1020 in a single chip with the IOH 1050.

The optional nature of additional processors 1015 is denoted in FIG. 10 with broken lines. Each processor 1010, 1015 may include one or more of the processor cores described herein and may be some version of the processor 900.

The memory 1040 may be, for example, dynamic random access memory (DRAM), phase change memory (PCM), or a combination of the two. For at least one embodiment, the controller hub 1020 communicates with the processor(s) 1010, 1015 via a multi-drop bus, such as a frontside bus (FSB), point-to-point interface such as QuickPath Interconnect (QPI), or similar connection 1095.

In one embodiment, the coprocessor 1045 is a special-purpose processor, such as, for example, a high-throughput MIC processor, a network or communication processor, compression engine, graphics processor, GPGPU, embedded processor, or the like. In one embodiment, controller hub 1020 may include an integrated graphics accelerator.

There can be a variety of differences between the physical resources 1010, 1015 in terms of a spectrum of metrics of merit including architectural, micro-architectural, thermal, power consumption characteristics, and the like.

In one embodiment, the processor 1010 executes instructions that control data processing operations of a general type. Embedded within the instructions may be coprocessor instructions. The processor 1010 recognizes these coprocessor instructions as being of a type that should be executed by the attached coprocessor 1045. Accordingly, the processor 1010 issues these coprocessor instructions (or control signals representing coprocessor instructions) on a coprocessor bus or other interconnect, to coprocessor 1045. Coprocessor(s) 1045 accept and execute the received coprocessor instructions.

Figure 11:
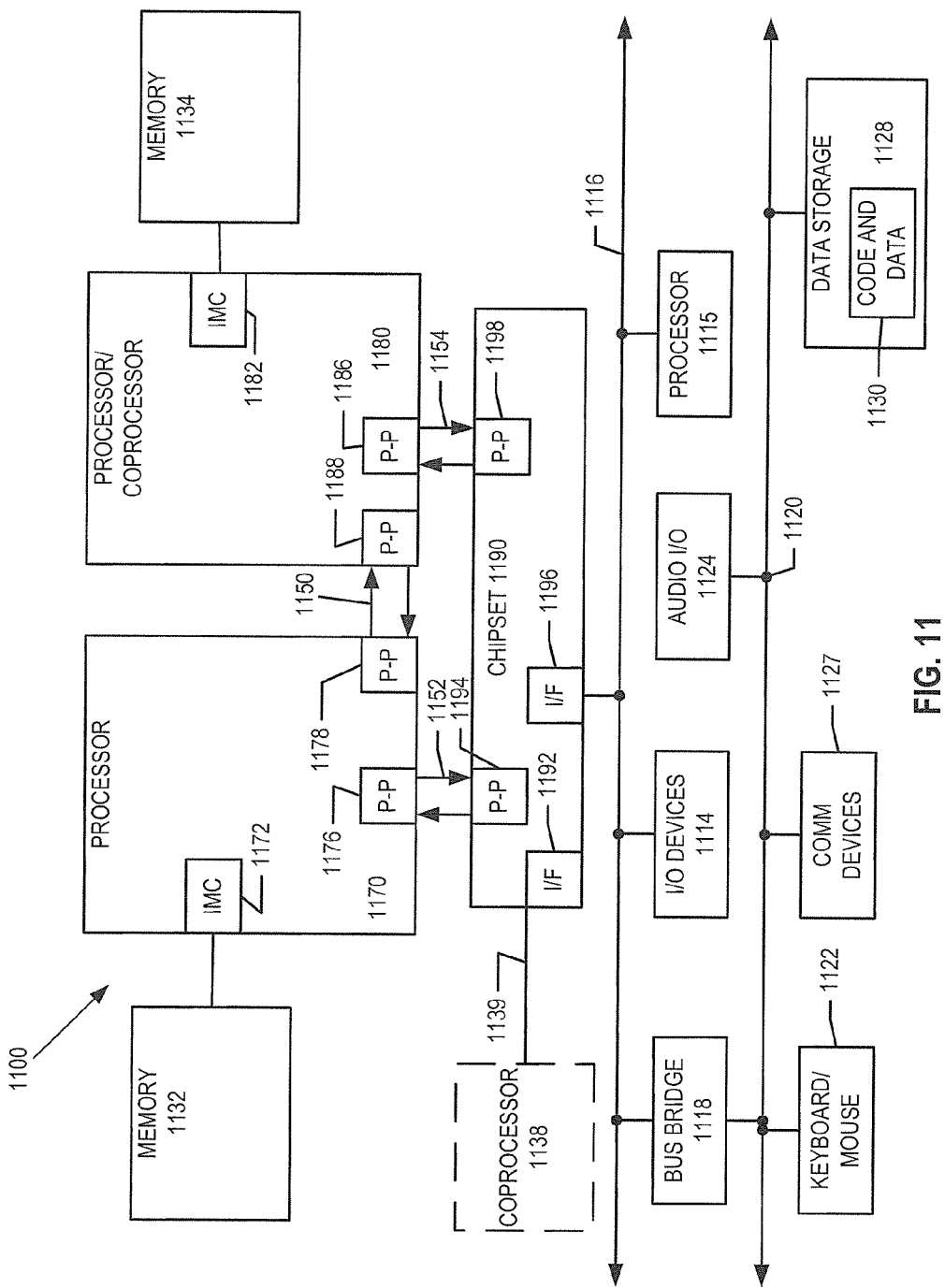
FIG. 11 is a block diagram of a second system in accordance with one embodiment.

Referring now to FIG. 11, shown is a block diagram of a first more specific exemplary system 1100 according to one embodiment. As shown in FIG. 11, multiprocessor system 1100 is a point-to-point interconnect system, and includes a first processor 1170 and a second processor 1180 coupled via a point-to-point interconnect 1150. Each of processors 1170 and 1180 may be some version of the processor 900. In one embodiment, processors 1170 and 1180 are respectively processors 1010 and 1015, while coprocessor 1138 is coprocessor 1045. In another embodiment, processors 1170 and 1180 are respectively processor 1010 coprocessor 1045.

Processors 1170 and 1180 are shown including integrated memory controller (IMC) units 1172 and 1182, respectively. Processor 1170 also includes as part of its bus controller units point-to-point (P-P) interfaces 1176 and 1178; similarly, second processor 1180 includes P-P interfaces 1186 and 1188. Processors 1170, 1180 may exchange information via a pointto-point (P-P) interface 1150 using P-P interface circuits 1178, 1188. As shown in FIG. 11, IMCs 1172 and 1182 couple the processors to respective memories, namely a memory 1132 and a memory 1134, which may be portions of main memory locally attached to the respective processors.

Processors 1170, 1180 may each exchange information with a chipset 1190 via individual P-P interfaces 1152, 1154 using point to point interface circuits 1176, 1194, 1186, 1198. Chipset 1190 may optionally exchange information with the coprocessor 1138 via a high-performance interface 1139. In one embodiment, the coprocessor 1138 is a special-purpose processor, such as, for example, a high-throughput MIC processor, a network or communication processor, compression engine, graphics processor, GPGPU, embedded processor, or the like.

A shared cache (not shown) may be included in either processor or outside of both processors, yet connected with the processors via P-P interconnect, such that either or both processors' local cache information may be stored in the shared cache if a processor is placed into a low power mode.

Chipset 1190 may be coupled to a first bus 1116 via an interface 1196. In one embodiment, first bus 1116 may be a Peripheral Component Interconnect (PCI) bus, or a bus such as a PCI Express bus or another third generation I/O interconnect bus. Alternative embodiments may also be used.

As shown in FIG. 11, various I/O devices 1114 may be coupled to first bus 1116, along with a bus bridge 1118 which couples first bus 1116 to a second bus 1120. In one embodiment, one or more additional processor(s) 1115, such as coprocessors, high-throughput MIC processors, GPGPU's, accelerators (such as, e.g., graphics accelerators or digital signal processing (DSP) units), field programmable gate arrays, or any other processor, are coupled to first bus 1116. In one embodiment, second bus 1120 may be a low pin count (LPC) bus. Various devices may be coupled to a second bus 1120 including, for example, a keyboard and/or mouse 1122, communication devices 1127 and a storage unit 1128 such as a disk drive or other mass storage device which may include instructions/code and data 1130, in one embodiment. Further, an audio I/O 1124 may be coupled to the second bus 1120. Note that other architectures are possible. For example, instead of the point-to-point architecture of FIG. 11, a system may implement a multi-drop bus or other such architecture.

Figure 12:
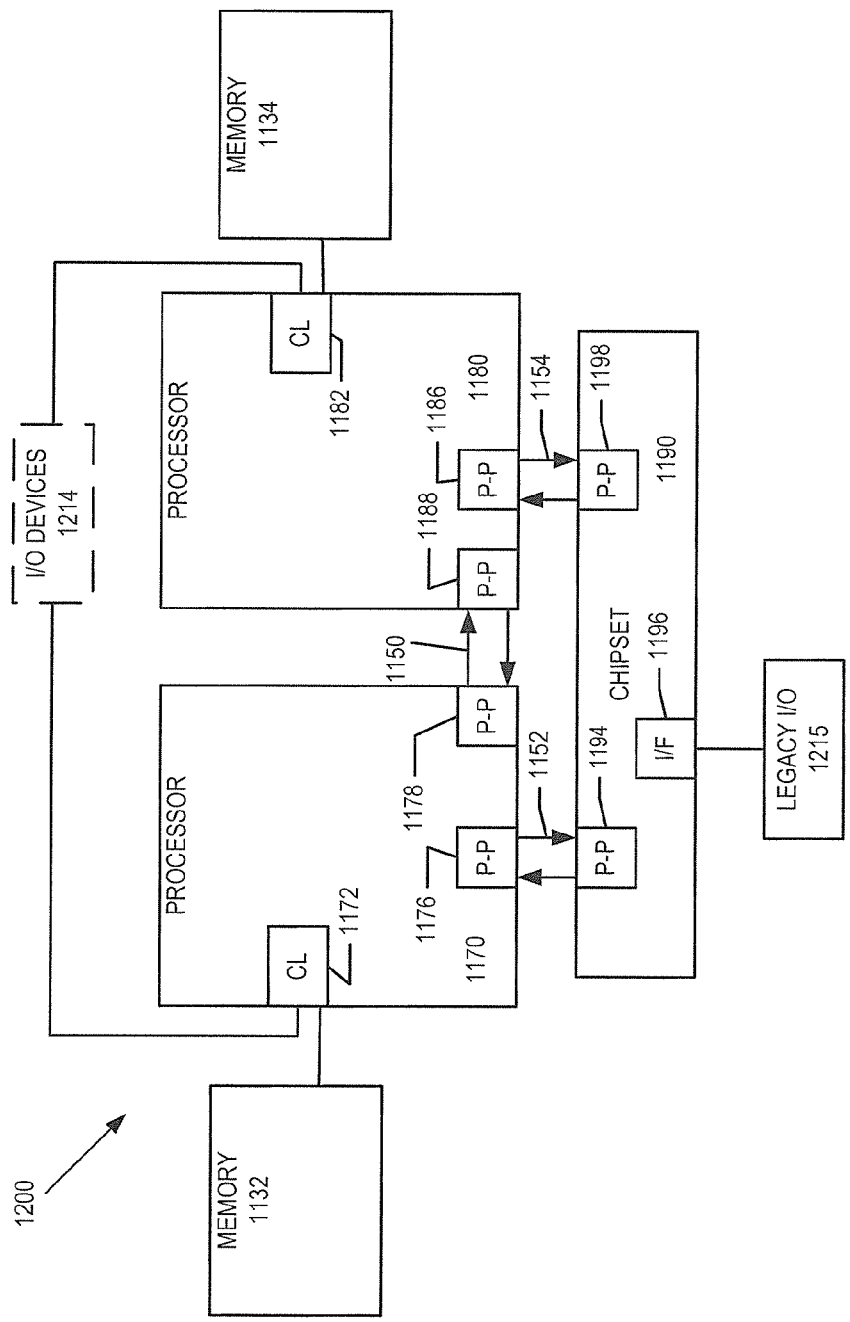
FIG. 12 is a block diagram of a third system in accordance with one embodiment.

Referring now to FIG. 12, shown is a block diagram of a second more specific exemplary system 1200 according to one embodiment. Like elements in FIGS. 11 and 12 bear like reference numerals, and certain aspects of FIG. 11 have been omitted from FIG. 12 in order to avoid obscuring other aspects of FIG. 12.

FIG. 12 illustrates that the processors 1170, 1180 may include integrated memory and I/O control logic ("CL") 1172 and 1182, respectively. Thus, the CL 1172, 1182 include integrated memory controller units and include I/O control logic. FIG. 12 illustrates that not only are the memories 1132, 1134 coupled to the CL 1172, 1182, but also that I/O devices 1214 are also coupled to the control logic 1172, 1182. Legacy I/O devices 1215 are coupled to the chipset 1190.

Figure 13:
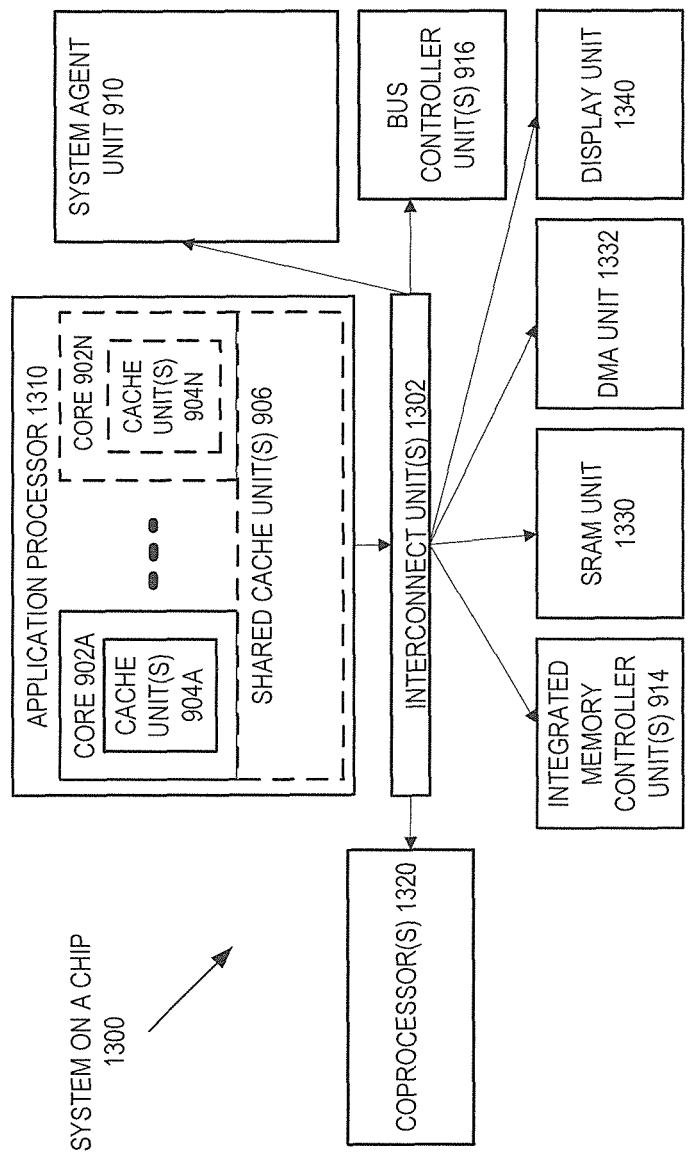
FIG. 13 is a block diagram of a system-on-a-chip (SoC) in accordance with one embodiment.

Referring now to FIG. 13, shown is a block diagram of a SoC 1300 according to one embodiment. Similar elements in FIG. 9 bear like reference numerals. Also, dashed lined boxes are optional features on more advanced SoCs. In FIG. 13, an interconnect unit(s) 1302 is coupled to: an application processor 1310 which includes a set of one or more cores 902A-N and shared cache unit(s) 906; a system agent unit 910; a bus controller unit(s) 916; an integrated memory controller unit(s) 914; a set or one or more coprocessors 1320 which may include integrated graphics logic, an image pro-cessor, an audio processor, and a video processor; an static random access memory (SRAM) unit 1330; a direct memory access (DMA) unit 1332; and a display unit 1340 for coupling to one or more external displays. In one embodiment, the coprocessor(s) 1320 include a special-purpose processor, such as, for example, a network or communication processor, compression engine, GPGPU, a high-throughput MIC processor, embedded processor, or the like.

Embodiments of the mechanisms disclosed herein may be implemented in hardware, software, firmware, or a combination of such implementation approaches. Embodiments may be implemented as computer programs or program code executing on programmable systems comprising at least one processor, a storage system (including volatile and non-volatile memory and/or storage elements), at least one input device, and at least one output device.

Program code, such as code 1130 illustrated in FIG. 11, may be applied to input instructions to perform the functions described herein and generate output information. The output information may be applied to one or more output devices, in known fashion. For purposes of this application, a processing system includes any system that has a processor, such as, for example; a digital signal processor (DSP), a microcontroller, an application specific integrated circuit (ASIC), or a microprocessor.

The program code may be implemented in a high level procedural or object oriented programming language to communicate with a processing system. The program code may also be implemented in assembly or machine language, if desired. In fact, the mechanisms described herein are not limited in scope to any particular programming language. In any case, the language may be a compiled or interpreted language.

One or more aspects of at least one embodiment may be implemented by representative instructions stored on a machine-readable medium which represents various logic within the processor, which when read by a machine causes the machine to fabricate logic to perform the techniques described herein. Such representations, known as "IP cores" may be stored on a tangible, machine readable medium and supplied to various customers or manufacturing facilities to load into the fabrication machines that actually make the logic or processor.

Such machine-readable storage media may include, without limitation, non-transitory, tangible arrangements of articles manufactured or formed by a machine or device, including storage media such as hard disks, any other type of disk including floppy disks, optical disks, compact disk read-only memories (CD-ROMs), compact disk rewritable's (CD-RWs), and magneto-optical disks, semiconductor devices such as read-only memories (ROMs), random access memories (RAMs) such as dynamic random access memories (DRAMs), static random access memories (SRAMs), erasable programmable read-only memories (EPROMs), flash memories, electrically erasable programmable read-only memories (EEPROMs), phase change memory (PCM), magnetic or optical cards, or any other type of media suitable for storing electronic instructions.

Accordingly, embodiments also include non-transitory, tangible machine-readable media containing instructions or containing design data, such as Hardware Description Language (HDL), which defines structures, circuits, apparatuses, processors and/or system features described herein. Such embodiments may also be referred to as program products.

While certain exemplary embodiments have been described and shown in the accompanying drawings, it is to be understood that such embodiments are merely illustrative of and not restrictive, and not be limited to the specific constructions and arrangements shown and described, since various other modifications may occur to those ordinarily skilled in the art upon studying this disclosure. In an area of technology such as this, where growth is fast and further advancements are not easily foreseen, the disclosed embodiments may be readily modifiable in arrangement and detail as facilitated by enabling technological advancements without departing from the principles of the present disclosure or the scope of the accompanying claims.

What is claimed is:

1. An apparatus comprising:
 hashing circuitry to identify multiple locations in one or more history buffers for searching for a target data in an input data stream;
 a plurality of match engines to perform multiple searches in parallel for the target data in the one or more history buffers;
 pipeline circuitry to pipeline searches for multiple sequential target data in the input data stream in consecutive clock cycles; and
 a match selector to select a result from the multiple searches and pipelined searches to compress the input data stream.

2. The apparatus of claim 1, wherein the hashing circuitry, the match engines and the match selector are located in execution circuitry of a processor.

3. The apparatus of claim 1, wherein the hashing circuitry, the match engines and the match selector are located in a co-processor coupled to a processor.

4. The apparatus of claim 1, further comprising:
 a plurality of encoders to receive assembled results from the multiple searches and the pipelined searches as a sequence of tokens and a header, wherein the header provides information about an offset of each of the tokens in the sequence, and wherein the encoders are to encode the tokens in parallel.

5. The apparatus of claim 1, wherein the match selector is to select a longest match from the multiple searches, and to integrate the longest match from the multiple searches with results of the pipelined searches.

6. The apparatus of claim 1, wherein the hashing circuitry is to hash the target data to obtain a pointer that points to a plurality of entries in a hash table, the entries containing multiple references to the multiple locations of the one or more history buffers, the hashing circuitry is to output the multiple references to enable the multiple locations to be read in parallel.

7. The apparatus of claim 1, further comprising:
 execution circuitry, which, in response to a parallel deflate instruction, performs the multiple searches and the pipeline searches in parallel.

8. A method comprising:
 identifying multiple locations in one or more history buffers for searching for a target data in an input data stream;
 performing multiple searches in parallel for the target data in the one or more history buffers;
 pipelining searches for multiple sequential target data in the input data stream in consecutive clock cycles; and
 selecting a result from the multiple searches and pipelined searches to compress the input data stream.

9. The method of claim 8, further comprising:
 assembling results from the multiple searches and the pipelined searches as a sequence of tokens and a header, wherein the header provides information about an offset of each of the tokens in the sequence; and
 encoding the tokens in parallel.

10. The method of claim 8, wherein selecting a result further comprises:
 selecting a longest match from the multiple searches; and
 integrating the longest match from the multiple searches with results of the pipelined searches.

11. The method of claim 8, wherein identifying the multiple locations further comprising:
 hashing the target data to obtain a pointer that points to a plurality of entries in a hash table, wherein the entries contain multiple references to the multiple locations of the one or more history buffers; and
 outputting the multiple references to enable the multiple locations to be read in parallel.

12. The method of claim 8, further comprising:
 keeping track of results of the multiple searches for the target data in a scoreboard; and
 updating multiple scoreboards for each of the multiple sequential target data.

13. The method of claim 8, further comprising:
 receiving an instruction to perform a network function; and
 performing deflate compression on the input data stream in response to the instruction, wherein the deflate compression includes the multiple searches and the pipelined searches.

14. A system comprising:
 memory; and
 processing circuitry coupled to the memory, wherein the processing circuitry comprises:
  hashing circuitry to identify multiple locations in one or more history buffers for searching for a target data in an input data stream;
  a plurality of match engines to perform multiple searches in parallel for the target data in the one or more history buffers;
  pipeline circuitry to pipeline searches for multiple sequential target data in the input data stream in consecutive clock cycles; and
  a match selector to select a result from the multiple searches and pipelined searches to compress the input data stream.

15. The system of claim 14, wherein the processing circuitry is located in execution circuitry of a processor.

16. The system of claim 14, wherein the processing circuitry is located in a co-processor coupled to a processor.

17. The system of claim 14, further comprising:
 a plurality of encoders to receive assembled results from the multiple searches and the pipelined searches as a sequence of tokens and a header, wherein the header provides information about an offset of each of the tokens in the sequence, and wherein the encoders are to encode the tokens in parallel.

18. The system of claim 14, wherein the match selector is to select a longest match from the multiple searches, and to integrate the longest match from the multiple searches with results of the pipelined searches.

19. The system of claim 14, wherein the hashing circuitry is to hash the target data to obtain a pointer that points to a plurality of entries in a hash table, the entries containing multiple references to the multiple locations of the one or more history buffers, the hashing circuitry is to output the multiple references to enable the multiple locations to be read in parallel.

20. The system of claim 14, further comprising:
 execution circuitry, which, in response to a parallel deflate instruction, performs the multiple searches and the pipeline searches in parallel.

* * * * *